United States Patent
Tsuchiya et al.

(10) Patent No.: US 10,211,076 B2
(45) Date of Patent: Feb. 19, 2019

(54) WAFER PROCESSING METHOD

(71) Applicant: DISCO CORPORATION, Tokyo (JP)

(72) Inventors: Toshio Tsuchiya, Tokyo (JP); Hitoshi Hoshino, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 15/484,799

(22) Filed: Apr. 11, 2017

(65) Prior Publication Data

US 2017/0301571 A1 Oct. 19, 2017

(30) Foreign Application Priority Data

Apr. 18, 2016 (JP) .................................. 2016-082781

(51) Int. Cl.
*G01R 31/26* (2014.01)
*H01L 21/67* (2006.01)
*H01L 21/683* (2006.01)
*H01L 23/544* (2006.01)
*H01L 21/66* (2006.01)

(52) U.S. Cl.
CPC .... *H01L 21/67115* (2013.01); *H01L 21/6836* (2013.01); *H01L 23/544* (2013.01); *H01L 22/20* (2013.01); *H01L 2221/68381* (2013.01); *H01L 2223/54426* (2013.01); *H01L 2223/54453* (2013.01); *H01L 2223/54493* (2013.01)

(58) Field of Classification Search
CPC ......... H01L 21/67115; H01L 21/67092; H01L 21/6836; H01L 21/68764; H01L 23/544; B23K 26/0665; B23K 26/0853; B23K 26/0869; B23K 26/082; B23K 26/0648; B23K 26/0626; B23K 26/0057

USPC .......................................................... 438/16
See application file for complete search history.

(56) References Cited

U.S. PATENT DOCUMENTS

| | | | | |
|---|---|---|---|---|
| 2004/0136000 A1* | 7/2004 | Kurokawa | ............... | B23Q 1/52 356/401 |
| 2009/0057841 A1* | 3/2009 | Sekiya | ................... | H01L 21/304 257/619 |
| 2013/0319985 A1* | 12/2013 | Nomaru | ............. | B23K 26/0665 219/121.75 |
| 2015/0332928 A1* | 11/2015 | Priewasser | .......... | H01L 21/6836 438/460 |

FOREIGN PATENT DOCUMENTS

| JP | 2007-019461 | 1/2007 |
|---|---|---|
| JP | 2015-147231 | 8/2015 |

* cited by examiner

*Primary Examiner* — Brook Kebede
(74) *Attorney, Agent, or Firm* — Greer Burns & Crain, Ltd.

(57) ABSTRACT

Disclosed herein is a wafer processing method for removing an annular reinforcing portion from a wafer having a device area, the annular reinforcing portion being formed around the device area. The wafer processing method includes the steps of supporting the wafer through an adhesive tape to an annular frame, forming a mark corresponding to a notch at a position radially inside a boundary portion between the annular reinforcing portion and the device area, cutting the boundary portion together with the adhesive tape to thereby separate the annular reinforcing portion from the device area, and moving the annular reinforcing portion supported through the adhesive tape to the annular frame away from a holding table to thereby remove the annular reinforcing portion from the wafer.

1 Claim, 5 Drawing Sheets

WAFER PROCESSING METHOD

BACKGROUND OF THE INVENTION

Field of the Invention

The present invention relates to a wafer processing method for removing an annular reinforcing portion from a wafer having a device area, the annular reinforcing portion being formed around the device area.

Description of the Related Art

A wafer having a plurality of devices such as integrated circuits (ICs) and large scale integrations (LSIs) on the front side is divided into a plurality of individual chips corresponding to the plural devices by using a dicing apparatus or the like. These chips are widely used so as to be built in various electronic equipment. For the purposes of reducing the size and weight of electronic equipment, the thickness of the wafer is reduced to 50 to 100 µm, for example. However, such a thin wafer has low rigidity, and warpage may also occur. Accordingly, the wafer is difficult to handle. To cope with this problem, there has been proposed a method of grinding the back side of the wafer in a central area corresponding to a device area where the devices are formed, thereby forming an annular reinforcing portion along the outer circumference of the wafer to increase the rigidity of the wafer (see Japanese Patent Laid-open No. 2007-019461, for example).

There has also been proposed a method of removing the annular reinforcing portion from the wafer before dividing the wafer along division lines (see Japanese Patent Laid-open No. 2015-147231, for example). In the method described in Japanese Patent Laid-open No. 2015-147231, an adhesive tape is attached to the front side of the wafer, and the adhesive tape is supported at its peripheral portion to an annular frame, thereby supporting the wafer through the adhesive tape to the annular frame. In this condition, a boundary portion between the device area and the annular reinforcing portion (peripheral marginal area) is cut together with the adhesive tape by laser processing to thereby separate the annular reinforcing portion from the device area. Thereafter, the annular reinforcing portion is removed together with the annular frame from the wafer.

SUMMARY OF THE INVENTION

However, in the wafer processing method described in Japanese Patent Laid-open No. 2015-147231, there is a problem such that when the annular reinforcing portion is removed from the wafer, a notch formed on the annular reinforcing portion is also removed from the wafer, so that alignment for the wafer in a subsequent step becomes difficult.

It is therefore an object of the present invention to provide a wafer processing method which can properly align the wafer even after removing the annular reinforcing portion from the wafer.

In accordance with an aspect of the present invention, there is provided a wafer processing method for processing a wafer having a front side, a back side, and an outer circumference, the front side having a device area where a plurality of devices are formed and a peripheral marginal area surrounding the device area, the outer circumference having a notch for indicating a crystal orientation, the back side having a circular recess corresponding to the device area and an annular reinforcing portion corresponding to the peripheral marginal area, the wafer processing method including a wafer supporting step of attaching the front side of the wafer to an adhesive tape supported at its peripheral portion to an annular frame having an inside opening in the condition where the wafer is set in the inside opening of the annular frame, thereby supporting the wafer through the adhesive tape to the annular frame; an annular reinforcing portion separating step of holding the wafer on a holding table in the condition where the adhesive tape is in contact with the holding table after performing the wafer supporting step, and next applying a laser beam having an absorption wavelength to the wafer, thereby cutting a boundary portion between the annular reinforcing portion and the device area together with the adhesive tape to separate the annular reinforcing portion from the device area; a mark forming step of forming a mark corresponding to the notch at a position radially inside the boundary portion before or after performing the annular reinforcing portion separating step; and an annular reinforcing portion removing step of moving the annular reinforcing portion supported through the adhesive tape to the annular frame away from the holding table after performing the annular reinforcing portion separating step and the mark forming step, thereby removing the annular reinforcing portion from the wafer.

With this configuration, the laser beam is applied along the boundary portion between the device area and the annular reinforcing portion of the wafer to thereby separate the annular reinforcing portion from the device area. Thereafter, the annular reinforcing portion is moved away from the holding table to thereby remove the annular reinforcing portion from the wafer. The mark corresponding to the notch formed on the outer circumference of the annular reinforcing portion is formed at a position radially inside the boundary portion between the device area and the annular reinforcing portion. Accordingly, even after the annular reinforcing portion is removed from the wafer, the mark is left on the wafer. As a result, the wafer can be properly aligned with reference to the mark in place of the notch in the subsequent step.

Preferably, the wafer processing method further includes a positional relation detecting step of detecting a positional relation between the notch and the mark formed on the wafer by using detecting means after performing the mark forming step and before performing the annular reinforcing portion separating step.

According to the present invention, the mark corresponding to the notch formed on the outer circumference of the annular reinforcing portion is formed at a position radially inside the boundary portion between the device area and the annular reinforcing portion. Accordingly, even after removing the annular reinforcing portion from the wafer, the wafer can be properly aligned in the subsequent step.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
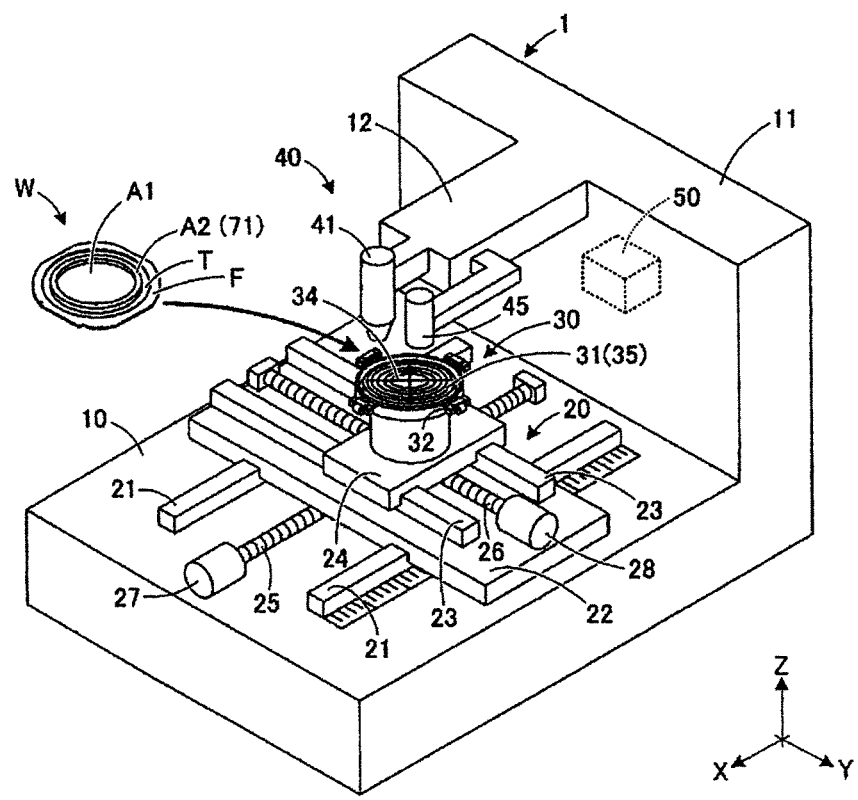
FIG. 1 is a perspective view of a laser processing apparatus for use in performing a wafer processing method according to a preferred embodiment of the present invention.

A wafer processing method according to a preferred embodiment of the present invention will now be described with reference to the attached drawings. FIG. 1 is a perspective view of a laser processing apparatus 1 for use in performing the wafer processing method according to this preferred embodiment. The configuration of the laser processing apparatus 1 shown in FIG. 1 is merely illustrative, and any other configurations may be used in performing the wafer processing method according to this preferred embodiment.

As shown in FIG. 1, the laser processing apparatus 1 includes laser beam applying means 40 for applying a laser beam to a wafer W held on a holding table 30, wherein the laser beam applying means 40 and the holding table 30 are relatively moved to process the wafer W. A plurality of crossing division lines (not shown) are formed on the front side of the wafer W to thereby define a plurality of separate regions where a plurality of devices (not shown) are formed. The front side of the wafer W is generally composed of a device area A1 where the plural devices are formed and a peripheral marginal area A2 surrounding the device area A1. Further, the outer circumference of the wafer W is formed with a notch N (see FIG. 4B) indicating a crystal orientation.

Figure 2:
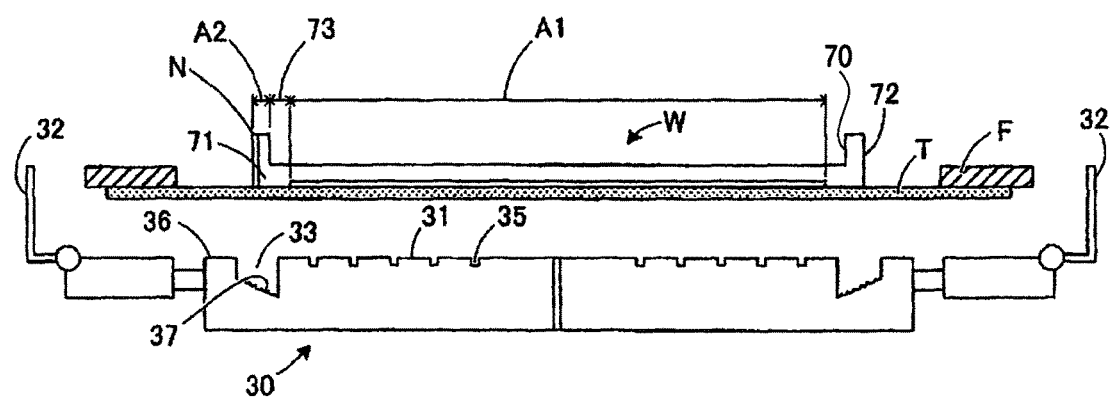
FIG. 2 is a schematic sectional view of a wafer and a holding table included in the laser processing apparatus shown in FIG. 1.

As shown in FIG. 2, the back side (upper surface) of the wafer W is formed with a circular recess 70 in a central area corresponding to the device area A1 to thereby form a projected annular reinforcing portion 71 around the circular recess 70 on the back side of the wafer W in a peripheral area corresponding to the peripheral marginal area A2. The circular recess 70 is formed by grinding the back side of the wafer W. This wafer W may be referred to as TAIKO wafer. Reference numeral 73 denotes a boundary portion between the device area A1 and the annular reinforcing portion 71 (the peripheral marginal area A2). Since the thickness of the wafer W in only the device area A1 is small, the rigidity of the wafer W is increased by the annular reinforcing portion 71 formed around the device area A1. That is, although the rigidity of the wafer W in the device area A1 is lacking due to its reduced thickness, the annular reinforcing portion 71 can compensate for such a lack in rigidity, thereby suppressing the warpage of the wafer W and preventing damage to the wafer W in transferring the wafer W. The wafer W may be a semiconductor wafer formed of silicon or gallium arsenide, for example, or may be an optical device wafer formed of ceramic, glass, or sapphire, for example.

An adhesive tape T is attached at its central portion to the front side of the wafer W, and an annular frame F is attached to the peripheral portion of the adhesive tape T. After the wafer W having the annular reinforcing portion 71 is subjected to predetermined processing, the annular reinforcing portion 71 is removed by the laser processing apparatus 1. As compared with mechanical dicing using a cutting blade, laser processing has an advantage such that a laser beam does not interfere with the annular reinforcing portion 71 in removing the annular reinforcing portion 71 from the wafer W. The predetermined processing mentioned above is processing to be performed to the wafer W having the annular reinforcing portion 71. For example, this processing is processing of forming a reflection film on the back side of the wafer W in the device area A1.

Referring back to FIG. 1, the laser processing apparatus 1 has a base 10 and a holding table moving mechanism 20 provided on the base 10 for moving the holding table 30 in the X direction shown by an arrow X and in the Y direction shown by an arrow Y. The holding table moving mechanism 20 includes a pair of parallel guide rails 21 provided on the base 10 so as to extend in the X direction and a motor-driven X table 22 slidably mounted on the guide rails 21. The holding table moving mechanism 20 further includes a pair of parallel guide rails 23 provided on the upper surface of the X table 22 so as to extend in the Y direction and a motor-driven Y table 24 slidably mounted on the guide rails 23.

A nut portion (not shown) is formed on the lower surface of the X table 22, and a ball screw 25 is threadedly engaged with the nut portion of the X table 22. A motor 27 for driving the X table 22 is connected to one end of the ball screw 25. Accordingly, when the motor 27 is operated, the ball screw 25 is rotated to thereby move the X table 22 in the X direction along the guide rails 21. Similarly, a nut portion (not shown) is formed on the lower surface of the Y table 24, and a ball screw 26 is threadedly engaged with the nut portion of the Y table 24. A motor 28 for driving the Y table 24 is connected to one end of the ball screw 26. Accordingly, when the motor 28 is operated, the ball screw 26 is rotated to thereby move the Y table 24 in the Y direction along the guide rails 23. As a result, the holding table 30 can be moved both in the X direction along the guide rails 21 and in the Y direction along the guide rails 23. The holding table 30 is mounted on the Y table 24 so as to be rotatable about a vertical axis extending in the Z direction shown by an arrow Z. The holding table 30 has an upper surface as a holding surface 31 for holding the wafer W thereon. A plurality of clamps 32 for clamping the annular frame F supporting the wafer W through the adhesive tape T are provided on the outer circumference of the holding table 30.

A vertical wall 11 is formed at the rear end of the base 10 on the rear side of the holding table 30. An arm portion 12 projects from the front surface of the vertical wall 11. The laser beam applying means 40 is provided at the front end of the arm portion 12 so as to be vertically opposed to the holding table 30. The laser beam applying means 40 includes a laser head 41 for applying a laser beam to the wafer W held on the holding table 30. That is, the laser beam is oscillated by an oscillator (not shown) and next focused by focusing means (not shown) toward the wafer W held on the holding table 30. The laser beam has an absorption wavelength to the wafer W, so that a part of the wafer W is sublimed by the application of the laser beam to the wafer W, i.e., laser ablation is performed.

The term of "ablation" used herein means a phenomenon such that when the intensity of a laser beam applied becomes greater than a predetermined processing threshold, the energy of the laser beam is converted into electronic, thermal, photoscientific, and mechanical energy on the surface of a solid, so that neutral atoms, molecules, positive and negative ions, radicals, clusters, electrons, and light are explosively emitted and the solid surface is etched.

Imaging means 45 for imaging the outer circumferential edge 72 (see FIG. 4B) of the wafer W is provided near the laser beam applying means 40. The outer circumferential edge 72 of the wafer W is imaged at arbitrary three positions by the imaging means 45. Each image obtained by the imaging means 45 is subjected to various image processing to detect the coordinates at these three positions on the outer circumferential edge 72. Thereafter, the center of the wafer W is calculated with reference to the coordinates at these three positions on the outer circumferential edge 72, and the laser head 41 is aligned with reference to the center of the wafer W. By performing this alignment, the laser head 41 can be accurately positioned directly above the boundary portion 73 between the device area A1 and the annular reinforcing portion 71 (the peripheral marginal area A2).

The laser processing apparatus 1 further includes control means 50 for centrally controlling all the components. The control means 50 includes a processor for performing various processing and a memory connected to the processor. The memory is composed of one or more storage media such as read only memory (ROM) and random access memory (RAM) according to uses. The ROM of the control means 50 preliminarily stores a program to be executed by the processor in performing various processing in the steps to be hereinafter described. The laser processing apparatus 1 performs laser processing along the boundary portion 73 between the device area A1 and the annular reinforcing portion 71 to thereby separate the annular reinforcing portion 71 from the device area A1.

In the case that a reflection film of metal is formed on the back side of the wafer W in the device area A1, the pattern on the front side of the wafer W cannot be seen from the back side of the wafer W by using an infrared (IR) camera or the like, so that the direction of the wafer W cannot be recognized. Accordingly, the notch N for alignment is formed on the outer circumference of the wafer W, so as to allow the recognition of the direction of the wafer W also from the back side thereof. However, after removing the annular reinforcing portion 71 from the wafer W, the notch N formed on the annular reinforcing portion 71 becomes absent, so that the wafer W cannot be aligned with reference to the notch N in the subsequent step.

Figure 4A:
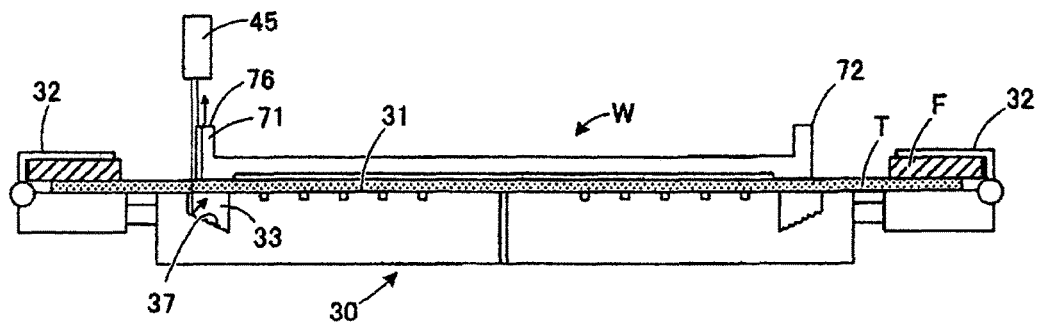
FIG. 4A is a schematic sectional view showing an imaging process in a mark forming step.
Figure 4B:
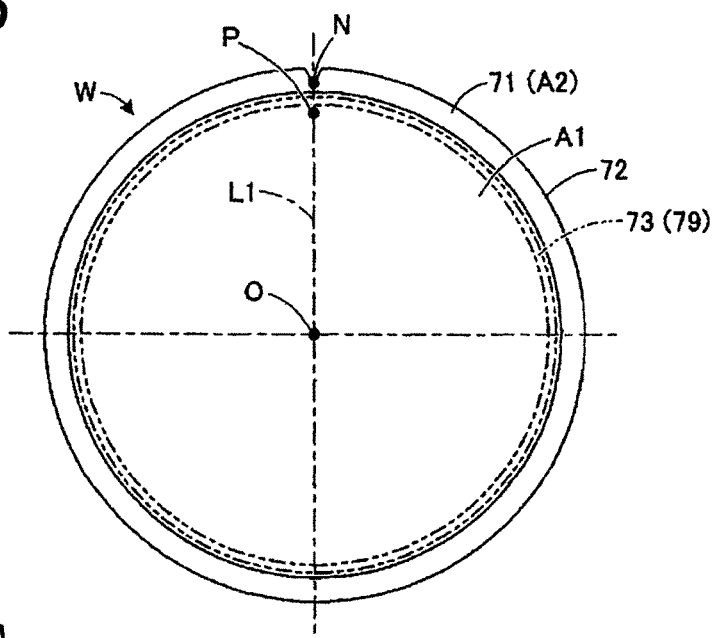
FIG. 4B is a schematic plan view showing a marking process in the mark forming step.
Figure 4C:
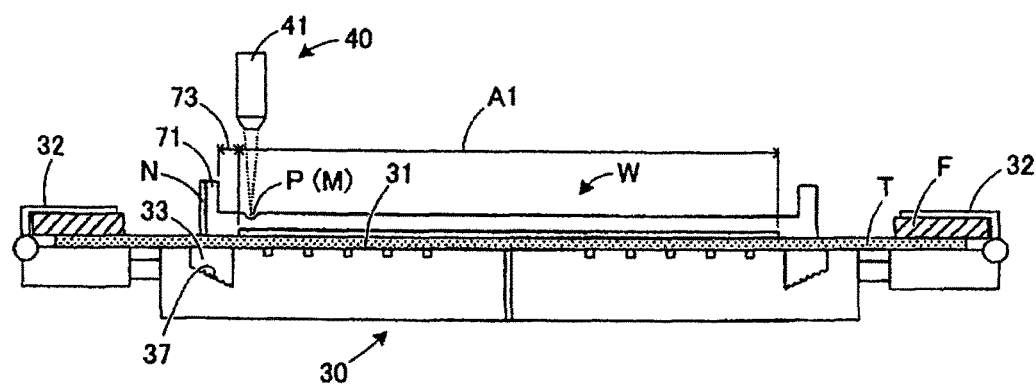
FIG. 4C is a schematic sectional view showing the marking process.

To cope with this problem, a mark M corresponding to the notch N is formed radially inside the boundary portion 73 between the device area A1 and the annular reinforcing portion 71 before separating the annular reinforcing portion 71 from the device area A1 (see FIG. 4C). Accordingly, even after removing the annular reinforcing portion 71 from the wafer W, the wafer W can be properly aligned with reference to the mark M in the subsequent step. That is, the direction of the wafer W can be recognized with reference to the mark M.

The holding table 30 to be used in performing the wafer processing method will now be described in more detail with reference to FIG. 2. FIG. 2 is a schematic sectional view of the wafer W and the holding table 30 in this preferred embodiment. The configuration of the holding table 30 shown in FIG. 2 is merely illustrative, and it may be suitably modified in the present invention.

As shown in FIG. 2, the upper surface of the holding table 30 is formed with an annular escape groove 33 for letting a laser beam escape in performing the ablation. The escape groove 33 is formed along the outer circumference of the holding table 30 so as to correspond to the boundary portion 73 between the device area A1 and the annular reinforcing portion 71 of the wafer W. A central portion of the upper surface of the holding table 30 radially inside the escape groove 33 is formed as the holding surface 31 for holding the wafer W and corresponds to the device area A1 of the wafer W. The holding surface 31 of the holding table 30 is formed with a pair of orthogonal suction grooves 34 (see FIG. 1) crossing at the center of the holding surface 31 and a plurality of concentric suction grooves 35 about the intersection of the suction grooves 34.

The suction grooves 34 and 35 are connected to a vacuum source (not shown) through a suction passage (not shown) formed in the holding table 30. Accordingly, a vacuum generated by the vacuum source is applied to the suction grooves 34 and 35, thereby holding the wafer W through the adhesive tape T on the holding surface 31. Further, a peripheral portion of the upper surface of the holding table 30 radially outside the escape groove 33 is formed as an annular support surface 36. The support surface 36 is flush with the holding surface 31 and corresponds to an annular area of the adhesive tape T between the wafer W and the annular frame F. Accordingly, the adhesive tape T is horizontally supported on the holding surface 31 and the support surface 36, and the annular reinforcing portion 71 is prevented from falling into the escape groove 33.

The escape groove 33 has an inclined bottom 37 increasing in depth toward the center of the holding table 30. The inclined bottom 37 of the escape groove 33 is formed with fine asperities for scattering the laser beam. The fine asperities may be formed by sandblast, for example. Owing to the inclination of the inclined bottom 37, the laser beam reflected from the inclined bottom 37 is deflected from the light source (laser head 41). Furthermore, the laser beam is scattered by the fine asperities formed on the inclined bottom 37, so that the intensity of the laser beam reflected from the inclined bottom 37 is reduced to thereby suppress damage to the light source due to the reflected light. Further, also in imaging the wafer W by using the imaging means 45 (see FIG. 4A), imaging light emitted from the imaging means 45 and reflected from the inclined bottom 37 is deflected from the imaging means 45 due to the inclination of the inclined bottom 37, and the intensity of the reflected imaging light is also reduced by the fine asperities of the inclined bottom 37. As a result, the contrast of an image showing the outer circumferential edge 72 of the wafer W as obtained by the imaging means 45 can be made high.

Figure 3:
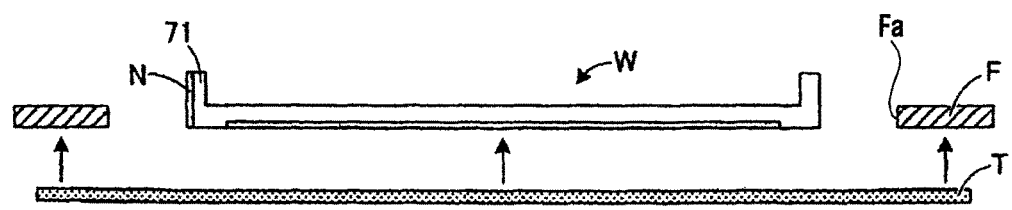
FIG. 3 is a schematic sectional view showing a wafer supporting step.
Figure 5:
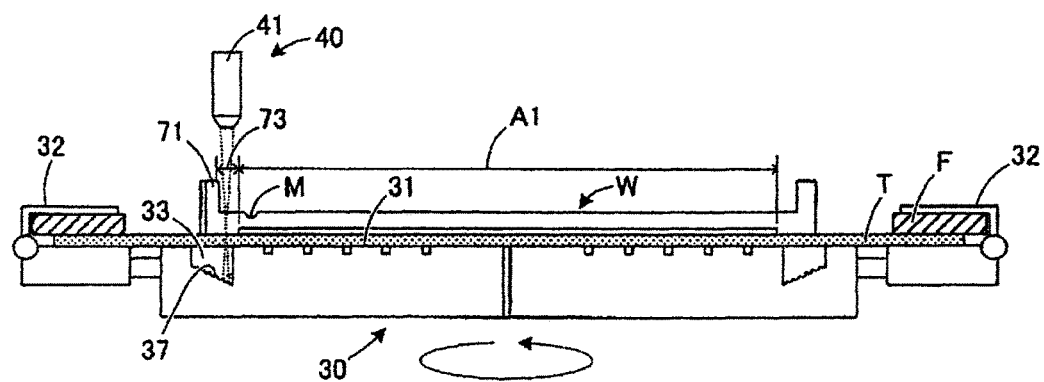
FIG. 5 is a schematic sectional view showing an annular reinforcing portion separating step.
Figure 6:
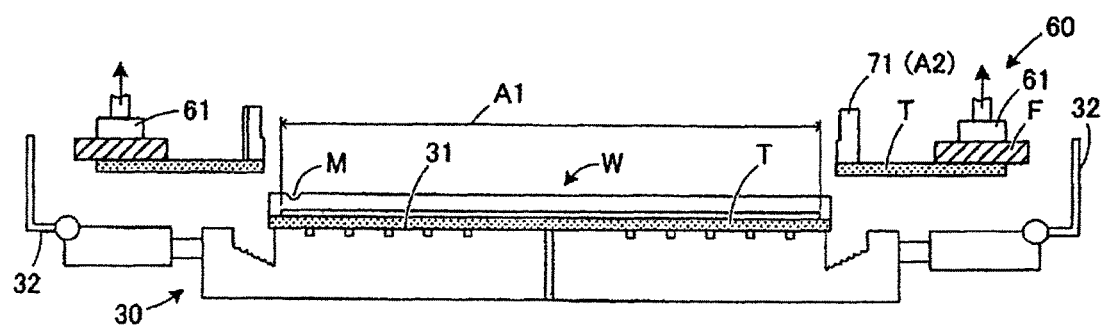
FIG. 6 is a schematic sectional view showing an annular reinforcing portion removing step.
Figure 7:
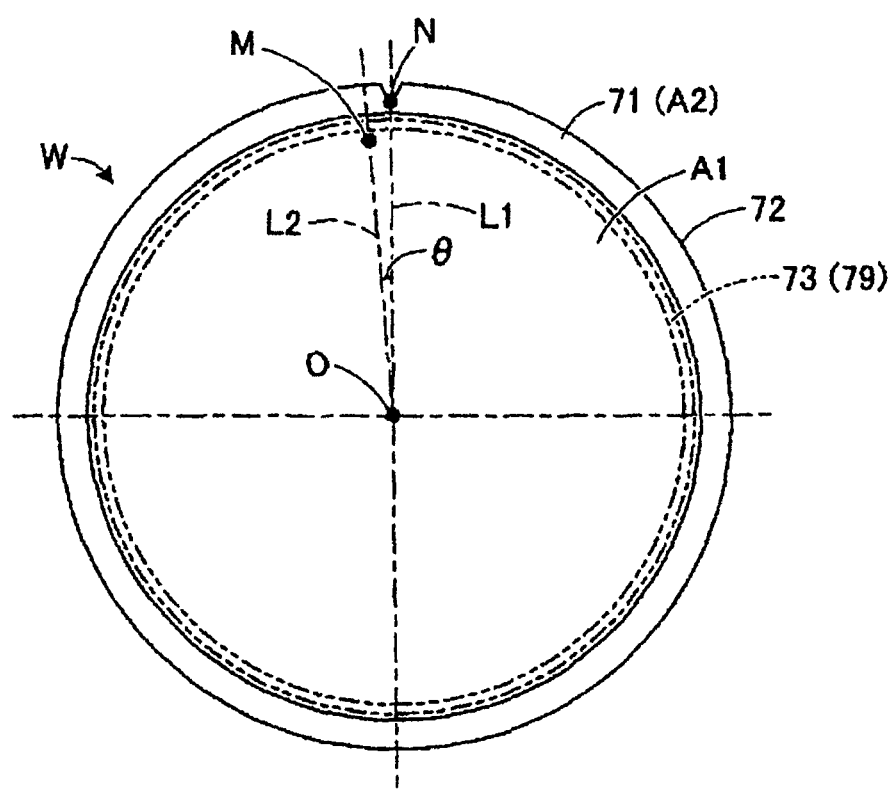
FIG. 7 is a schematic plan view showing a positional relation detecting step.

The wafer processing method according to this preferred embodiment will now be described in more detail with reference to FIGS. 3 to 7. FIG. 3 shows a wafer supporting step, FIGS. 4A to 4C show a mark forming step, FIG. 5 shows an annular reinforcing portion separating step, FIG. 6 shows an annular reinforcing portion removing step, and FIG. 7 shows a positional relation detecting step. The following wafer processing method is merely illustrative and it may be suitably changed. FIG. 4A shows an imaging process for the wafer W, and FIGS. 4B and 4C show a marking process for the wafer W.

As shown in FIG. 3, the wafer supporting step is first performed in the following manner. In the wafer supporting step, the wafer W is set in the inside opening Fa of the annular frame F, and the adhesive tape T is attached to the front side (lower surface) of the wafer W and one side (lower surface) of the annular frame F. Accordingly, the wafer W is supported through the adhesive tape T to the annular frame F in the condition where the annular reinforcing portion 71 is oriented upward. Thereafter, the wafer W supported through the adhesive tape T to the annular frame F is transferred to the laser processing apparatus 1 (see FIG. 1).

The wafer supporting step may be manually performed by an operator or may be performed by a tape mounter (not shown).

After performing the wafer supporting step shown in FIG. 3, the imaging process in the mark forming step is performed as shown in FIG. 4A. In the imaging process shown in FIG. 4A, the wafer W is held through the adhesive tape T on the holding table 30 of the laser processing apparatus 1 (see FIG. 1) in the condition where the annular reinforcing portion 71 is oriented upward, and the annular frame F is fixed by the clamps 32. Thereafter, the holding table 30 is suitably moved to position the annular reinforcing portion 71 of the wafer W directly below the imaging means 45. At this time, imaging light is applied from the imaging means 45 to the outer circumferential edge 72 of the wafer W and its peripheral area. The imaging light applied is reflected from the outer circumferential edge 72 and its periphery and then returned to the imaging means 45, thereby forming an image.

As shown in FIG. 4A, the annular reinforcing portion 71 has a horizontal upper surface 76 radially inside the outer circumferential edge 72. The imaging light applied from the imaging means 45 is reflected on the upper surface 76 of the annular reinforcing portion 71 to cause halation. The reflected light from the outer circumferential edge 72 and the upper surface 76 of the annular reinforcing portion 71 is captured by the imaging means 45. On the other hand, the escape groove 33 is present radially outside the outer circumferential edge 72. Accordingly, the imaging light applied from the imaging means 45 is transmitted through the adhesive tape T and next reflected on the inclined bottom 37 of the escape groove 33. The reflected light from the inclined bottom 37 is directed toward the center of the wafer W and also scattered by the fine asperities on the inclined bottom 37. Accordingly, the reflected light from the inclined bottom 37 of the escape groove 33 present radially outside the outer circumferential edge 72 is hardly captured by the imaging means 45.

In the image of the outer circumferential edge 72 and its periphery, a portion of the image corresponding to the upper surface 76 present radially inside the outer circumferential edge 72 is seen as a bright portion because the reflected light from the upper surface 76 is captured by the imaging means 45, whereas the other portion of the image corresponding to the inclined bottom 37 present radially outside the outer circumferential edge 72 is seen as a dark portion because the reflected light from the inclined bottom 37 is hardly captured by the imaging means 45. Accordingly, the contrast in the image of the outer circumferential edge 72 and its periphery can be made high, so that the outer circumferential edge 72 of the wafer W can be surely recognized. In this manner, the outer circumferential edge 72 of the wafer W is imaged at a plurality of positions (three positions in this preferred embodiment) by the imaging means 45. According to the images at these plural positions on the outer circumferential edge 72, the coordinates at these plural positions are detected and the center O (see FIG. 4B) of the wafer W is calculated according to the coordinates detected above.

After performing the imaging process shown in FIG. 4A, the marking process in the mark forming step is performed as shown in FIG. 4B. In the marking process, the mark M (see FIG. 4C) corresponding to the notch N is formed at a position radially inside the boundary portion 73 between the annular reinforcing portion 71 and the device area A1, i.e., radially inside a laser processed mark 79 to be formed in the subsequent annular reinforcing portion separating step. More specifically, a marking position P is determined radially just inside the boundary portion 73 so as to lie on a straight line L1 connecting the center O and the notch N of the wafer W. This marking position P is set directly below the laser head 41 (see FIG. 4C). The position of the notch N may be detected according to the distance and direction from the center O of the wafer W as previously stored or may be detected by the imaging means 45 in detecting the outer circumferential edge 72.

Thereafter, the focal point of the laser beam to be applied from the laser head 41 is adjusted to a position near the upper surface (back side) of the wafer W. In this condition, the laser beam is applied from the laser head 41 to the marking position P set radially inside the boundary portion 73 between the device area A1 and the annular reinforcing portion 71 of the wafer W as shown in FIG. 4C. As described above, the laser beam has an absorption wavelength to the wafer W, so that the upper surface of the wafer W is partially removed by the laser beam at the marking position P to thereby form the mark M corresponding to the notch N. Thus, the laser beam applying means 40 including the laser head 41 functions as marking means for forming the mark M on the upper surface of the wafer W. As a modification, such marking means may be provided by inkjet type application means for applying an ink to the upper surface of the wafer W to form a mark.

After performing the mark forming step shown in FIGS. 4A to 4C, the annular reinforcing portion separating step is performed as shown in FIG. 5. In the annular reinforcing portion separating step, the laser beam having an absorption wavelength to the wafer W is applied from the laser head 41 to the boundary portion 73 between the device area A1 and the annular reinforcing portion 71 in the condition where the wafer W is held on the holding table 30, thereby cutting the boundary portion 73. That is, the annular reinforcing portion 71 is separated from the device area A1. More specifically, the holding table 30 is suitably moved to position the boundary portion 73 directly below the laser head 41. Thereafter, the focal point of the laser beam is adjusted, and the laser beam is then applied from the laser head 41 to the boundary portion 73.

In the condition where the laser beam is being applied, the holding table 30 is rotated to thereby cut the boundary portion 73 together with the adhesive tape T. Accordingly, the annular reinforcing portion 71 is separated from the device area A1. At this time, the laser beam penetrates the wafer W and the adhesive tape T and is then reflected on the inclined bottom 37 of the escape groove 33. The reflected light from the inclined bottom 37 is directed toward the center of the holding table 30. Further, since the fine asperities are formed on the inclined bottom 37, the laser beam is scattered from the inclined bottom 37 to reduce the intensity. Accordingly, the reflected light from the inclined bottom 37 is hardly returned to the laser head 41. Even if the laser beam is reflected toward the laser head 41, the laser source is not damaged by the reflected light because the intensity is low.

In this manner, the boundary portion 73 between the device area A1 and the annular reinforcing portion 72 is cut by the laser beam in the annular reinforcing portion separating step. However, if the width of a cut groove formed by the laser beam is small, there is a possibility that this cut groove may be filled with debris produced by the ablation. To cope with this problem, the annular reinforcing portion separating step may be repeated concentrically to increase the width of the cut groove cutting the boundary portion 73 between the device area A1 and the annular reinforcing portion 71. Accordingly, the annular reinforcing portion 71 can be completely separated from the device area A1.

After performing the annular reinforcing portion separating step shown in FIG. 5, the annular reinforcing portion removing step is performed as shown in FIG. 6. In the annular reinforcing portion removing step, the clamps 32 clamping the annular frame F is released, and transfer means 60 having a plurality of suction pads 61 is set directly above the holding table 30. Thereafter, the suction pads 61 are operated to hold the annular frame F under suction. Thereafter, the suction pads 61 are raised to vertically move the annular frame F supporting the annular reinforcing portion 71 through the adhesive tape T away from the holding table 30. Accordingly, the annular reinforcing portion 71 is removed from the wafer W, and only the device area A1 is left on the holding table 30.

After removing the annular reinforcing portion 71 from the wafer W, it cannot be checked whether the mark M accurately corresponds to the notch N. In this respect, the positional relation detecting step shown in FIG. 7 may be performed after performing the mark forming step and before performing the annular reinforcing portion separating step, so as to detect the positional relation between the mark M and the notch N. In the positional relation detecting step, the mark M formed on the wafer W is positioned directly below the imaging means 45 (see FIG. 4A), and the mark M is imaged by the imaging means 45. Thereafter, the coordinates of the mark M are accurately detected from an image obtained by the imaging means 45. Thusly, the positional relation between the mark M and the notch N can be accurately detected.

As a modification, this step may include a step of determining an angle θ between a straight line L1 connecting the center O of the wafer W and the notch N and a straight line L2 connecting the center O of the wafer W and the mark M as shown in FIG. 7. Accordingly, it is possible to recognize an angular deviation of the orientation of the mark M as seen from the center O of the wafer W from the orientation of the notch N as seen from the center O of the wafer W. The angular deviation of the mark M with respect to the notch N or the coordinates of the mark M may be used in alignment of processing means with respect to each division line (not shown) formed on the wafer W in the subsequent step. Thus, the imaging means 45 functions as detecting means for accurately detecting the positional relation between the mark M and the notch N. As a modification, such detecting means may be provided by any configuration capable of recognizing the mark M formed on the wafer W.

In the wafer processing method according to this preferred embodiment as described above, the laser beam is applied along the boundary portion 73 between the device area A1 and the annular reinforcing portion 71 of the wafer W to thereby separate the annular reinforcing portion 71 from the device area A1. Thereafter, the annular reinforcing portion 71 is moved away from the holding table 30 to thereby remove the annular reinforcing portion 71 from the wafer W. The mark M corresponding to the notch N formed on the outer circumference of the annular reinforcing portion 71 is formed at a position radially inside the boundary portion 73 between the device area A1 and the annular reinforcing portion 71. Accordingly, even after the annular reinforcing portion 71 is removed from the wafer W, the mark M is left on the wafer W. As a result, the wafer W can be properly aligned with reference to the mark M in place of the notch N in the subsequent step.

The present invention is not limited to the above preferred embodiment, but various modifications may be made. In the above preferred embodiment, the size, shape, etc. shown in the attached drawings are merely illustrative and they may be suitably changed within the scope where the effect of the present invention can be exhibited. Further, various modifications may be made without departing from the scope of the object of the present invention.

For example, while the escape groove 33 is formed on the upper surface of the holding table 30 in the above preferred embodiment, the escape groove 33 may not be formed on the upper surface of the holding table 30, provided that the light source of the laser beam is not damaged by the reflected light from the upper surface of the holding table 30.

While the mark forming step is performed before performing the annular reinforcing portion separating step in the above preferred embodiment, the mark forming step may be performed after performing the annular reinforcing portion separating step.

While the mark M is formed at a position radially inside the boundary portion 73 between the device area A1 and the annular reinforcing portion 71 so as to lie on the straight line L1 connecting the center O of the wafer W and the notch N in the above preferred embodiment, the mark M may be formed at any position corresponding to the notch N radially inside the boundary portion 73 between the device area A1 and the annular reinforcing portion 71. For example, the mark M may be formed at a position radially inside the boundary portion 73 so as to lie on a straight line orthogonal to the straight line L1 connecting the center O of the wafer W and the notch N. In other words, the mark M corresponding to the notch N means the mark M having a clear positional relation with respect to the notch N.

Further, while all of the mark forming step, the annular reinforcing portion separating step, the annular reinforcing portion removing step, and the positional relation detecting step are performed by the same laser processing apparatus 1 in the above preferred embodiment, these steps may be performed by separate apparatuses.

As described above, the present invention has such an effect that the wafer can be properly aligned even after removing the annular reinforcing portion from the wafer. In particular, the present invention is useful as a wafer processing method in the case of removing the annular reinforcing portion from a wafer having a reflection film of metal on the back side of the device area.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A wafer processing method for processing a wafer having a front side, a back side, and an outer circumference, said front side having a device area where a plurality of devices are formed and a peripheral marginal area surrounding said device area, said outer circumference having a notch for indicating a crystal orientation, said back side having a circular recess corresponding to said device area and an annular reinforcing portion corresponding to said peripheral marginal area, said wafer processing method comprising:

a wafer supporting step of attaching the front side of said wafer to an adhesive tape supported at its peripheral portion to an annular frame having an inside opening in the condition where said wafer is set in said inside opening of said annular frame, thereby supporting said wafer through said adhesive tape to said annular frame;

an annular reinforcing portion separating step of holding said wafer on a holding table in the condition where said adhesive tape is in contact with said holding table after performing said wafer supporting step, and next applying a laser beam having an absorption wavelength to said wafer, thereby cutting a boundary portion between said annular reinforcing portion and said device area together with said adhesive tape to separate said annular reinforcing portion from said device area;

a mark forming step of forming a mark corresponding to said notch at a position radially inside said boundary portion before performing said annular reinforcing portion separating step;

an annular reinforcing portion removing step of moving said annular reinforcing portion supported through said adhesive tape to said annular frame away from said holding table after performing said annular reinforcing portion separating step and said mark forming step, thereby removing said annular reinforcing portion from said wafer; and a positional relation detecting step of detecting a positional relation between said notch and said mark formed on said wafer by using detecting means after performing said mark forming step and before performing said annular reinforcing portion separating step.

* * * * *